(12) United States Patent
Wilhelm (10) Patent No.: US 7,215,189 B2
(45) Date of Patent: May 8, 2007

(54) BOOTSTRAP DIODE EMULATOR WITH DYNAMIC BACK-GATE BIASING

(75) Inventor: Dana Wilhelm, Temple City, CA (US)

(73) Assignee: International Rectifier Corporation, El Segundo, CA (US)

( * ) Notice: Subject to any disclaimer, the term of this patent is extended or adjusted under 35 U.S.C. 154(b) by 648 days.

(21) Appl. No.: 10/712,893

(22) Filed: Nov. 12, 2003

(65) Prior Publication Data

US 2005/0102128 A1    May 12, 2005

(51) Int. Cl.
*H02M 7/537* (2006.01)
*H02M 7/00* (2006.01)
*G05F 1/00* (2006.01)

(52) U.S. Cl. ................. 327/589; 323/282; 363/98
(58) Field of Classification Search ............... 327/589; 323/282; 363/98
See application file for complete search history.

(56) References Cited

U.S. PATENT DOCUMENTS 5,077,490 A * 12/1991 Brown ................ 326/110
5,373,435 A * 12/1994 Jayaraman et al. ........ 363/98
5,502,632 A * 3/1996 Warmerdam et al. ........ 363/98
6,643,145 B1 * 11/2003 Harrison ................ 363/16
6,815,936 B2 * 11/2004 Wiktor et al. ............. 323/282

FOREIGN PATENT DOCUMENTS

EP    0 743 752 A1    11/1996

* cited by examiner

*Primary Examiner*—Evan Pert (57) ABSTRACT

A bootstrap diode emulator circuit for use in a half-bridge switching circuit employing transistors connected to one another in a totem pole configuration, a driver circuit for driving the transistors, and a bootstrap capacitor for providing power to the high-side driver circuit. The bootstrap diode emulator circuit includes an LDMOS transistor having a gate, a back-gate, a source and a drain, the drain of the LDMOS transistor being coupled to the high-side supply node, the source of the LDMOS transistor being coupled to the low-side supply node; a gate control circuit electrically coupled to the gate of the LDMOS transistor, and a dynamic back-gate biasing circuit electrically coupled to the back-gate of the LDMOS transistor. The dynamic back-gate biasing circuit is operable to dynamically bias the back-gate of the LDMOS transistor when the LDMOS is turned on by applying a voltage to the back-gate of the LDMOS transistor that is close to but slightly lower than a voltage of the drain of the LDMOS transistor.

12 Claims, 7 Drawing Sheets

BOOTSTRAP DIODE EMULATOR WITH DYNAMIC BACK-GATE BIASING

FIELD OF THE INVENTION

The present invention relates to high voltage half-bridge driver circuits and circuits for emulating bootstrap diodes in bootstrap capacitor charging circuit.

BACKGROUND OF THE INVENTION

Figure 1:
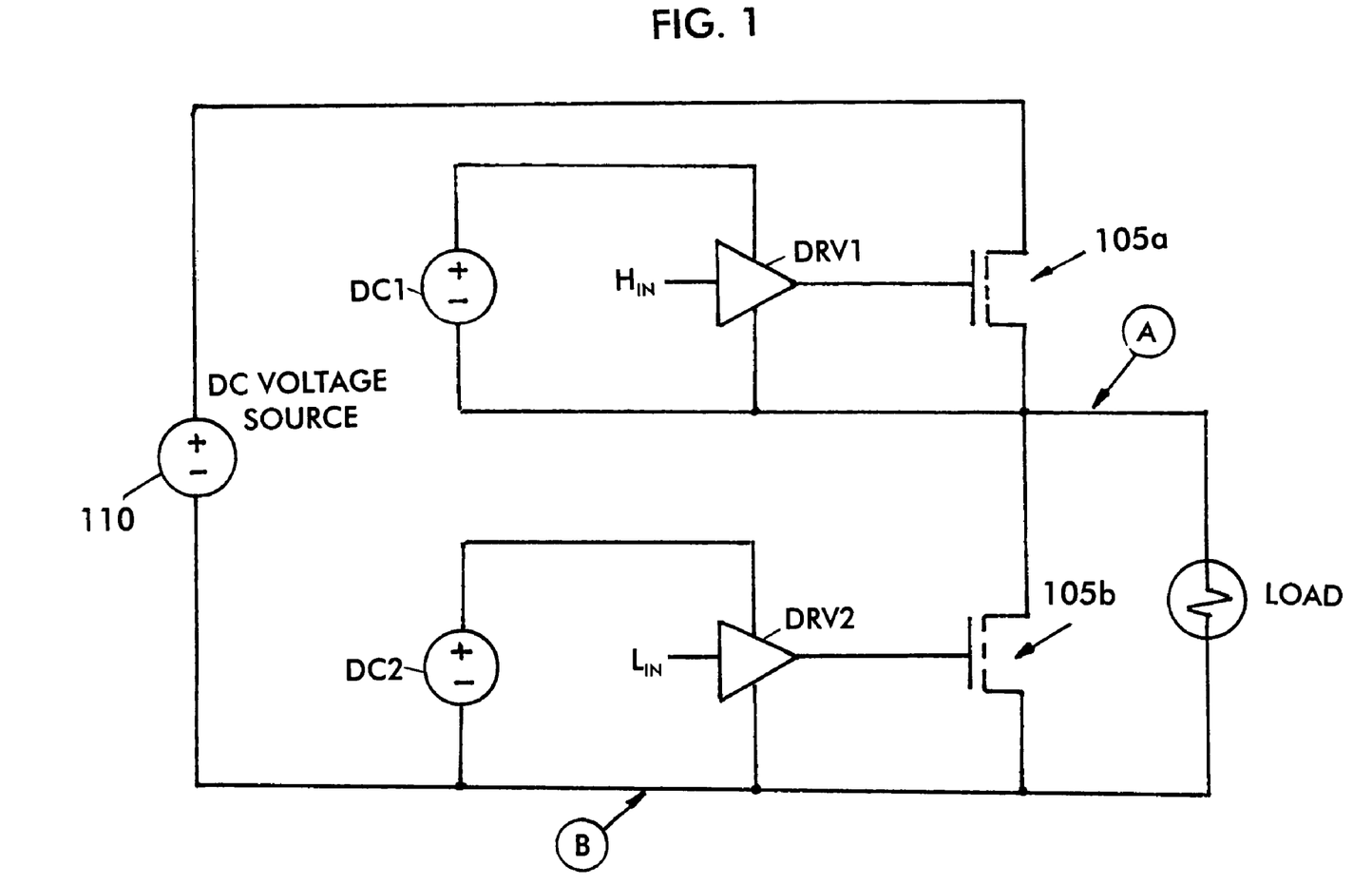
FIG. 1 illustrates a conventional high voltage half-bridge driver circuit.

High voltage half-bridge switching circuits are used in various applications such as motor drives, electronic ballasts for fluorescent lamps and power supplies. The half-bridge circuits employ a pair of totem pole connected switching elements (e.g., transistors, IGBTs, and/or FET devices) that are placed across a DC high voltage power supply. For example, referring to FIG. 1, there is seen a conventional half-bridge switching circuit 100 as known in the prior art. Half-bridge circuit switching 100 includes transistors 105a, 105b connected to one another at load node "A" in a totem pole configuration, DC voltage source 110 electrically connected to the drain of transistor 105a and the source of transistor 105b, gate drive buffers DRV1, DRV2 electrically connected to the gates of transistors 105a, 105b, respectively, to supply appropriate control signals to turn on and off transistors 105a, 105b, and DC voltage supplies DC1, DC2 for providing electrical power to FET devices 105a, 105b, respectively. DC voltage supplies DC1, DC2 are generally lower in voltage that DC voltage source 110, since the gate drive voltage levels needed to properly drive transistors 105a, 105b are generally much lower than that supplied by DC voltage source 110. As shown in FIG. 1, the lower transistor 105b, DC voltage supply DC2, DC voltage source 110, and DRV2 all share a common node "B," and upper transistor 105a, DC voltage supply DC1, and DRV1 share common load node "A."

In operation, transistors 105a, 105b are diametrically controlled, so that transistors 105a, 105b are never turned on at the same time. That is, transistor 105b remains off when transistor 105a is turned on, and vice versa. In this manner, the voltage of load node "A" (i.e., the output node connected to the load) is not fixed, but rather assumes either the voltage level of DC voltage source 110 or zero volts, depending on which of transistors 105a, 105b is turned on at a given instant.

Figure 2:
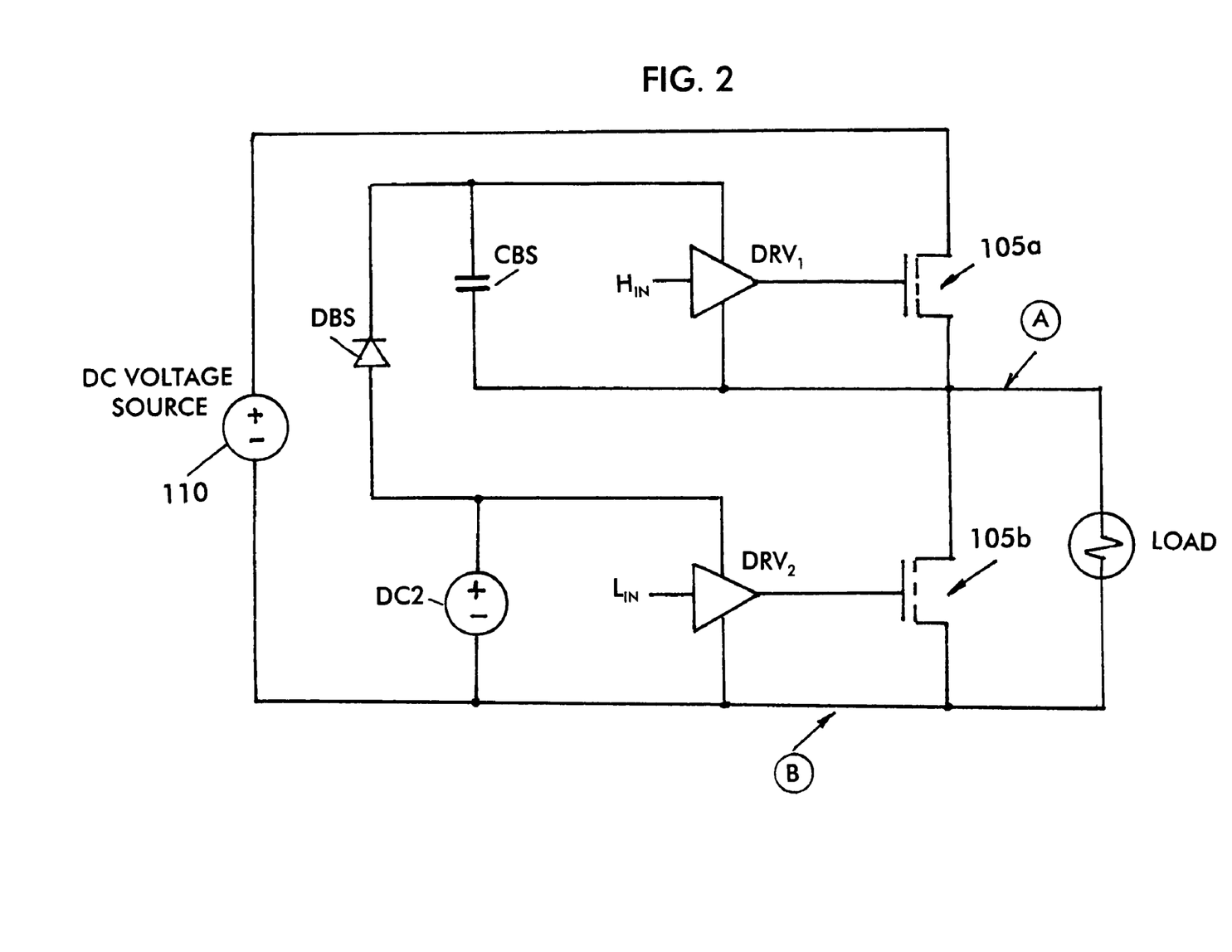
FIG. 2 illustrates a conventional high voltage half-bridge driver circuit employing a bootstrap diode and bootstrap capacitor.

DC voltage supply DC2 may be derived relatively easily, for example, by tapping an appropriate voltage level (e.g., by using a voltage divider) from DC voltage source 110, since voltage supply DC2 and DC voltage source 110 share a common node. However, a "bootstrap" technique is required to derive DC voltage supply DC1, since voltage supply DC1 needs to be floating with respect to DC voltage source 110. For this purpose, voltage supply DC1 is derived from DC voltage supply DC2, for example, by connecting a high voltage diode DBS between DC voltage supplies DC1, DC2, as shown in FIG. 2. A capacitor CBS serves as voltage supply DC1 used to power driver DRV1.

When transistor 105b is turned on, load node "A" is effectively connected to zero volts, and diode DBS allows current to flow from power supply DC2 to capacitor CBS, thereby charging capacitor CBS to approximately the voltage level of DC power supply DC2. When transistor FET 105b is turned off and transistor 105a is turned on, the voltage at load node "A" will assume approximately the voltage level of DC voltage source 110, which causes diode DBS to become reverse biased, with no current flowing from DC2 to capacitor CBS. While diode DBS remains reverse biased, the charge stored in capacitor CBS supplies buffer DRV1 with voltage. However, capacitor CBS will supply voltage to DRV1 for only a finite amount time, and thus transistor M1 needs to be turned off and transistor 105b turned on to replenish the charge stored in capacitor CBS.

In many of today's half-bridge driver circuits, the bootstrap capacitor and the bootstrap diode DBS via are formed from discrete components provided off-chip, since the required capacitance of the bootstrap capacitor and the breakdown voltage and peak current capacity required of the bootstrap diode are too large to be produced on chip.

U.S. Pat. No. 5,502,632 to Warmerdam (hereinafter "the '632 reference") relates to a high voltage integrated circuit driver employing a bootstrap diode emulator. The emulator includes an LDMOS transistor that is controlled to charge the bootstrap capacitor only when he low-side driver circuit is driven. The LDMOS transistor is operated in a source follower configuration with its source electrode connected the low-side power supply node and its drain electrode connected to the bootstrap capacitor. While the LDMOS transistor is driven, the current conducted through a parasitic transistor is limited, since such conduction shunts current available for charging bootstrap capacitor C1. Furthermore, the back-gate of the '632 LDMOS transistor is clamped to a biasing voltage during normal operation to ensure a that a constant 4V gate-to-source voltage is required to turn on the LDMOS transistor.

Although conventional bootstrap diode emulators, such as the emulator described in the '632 patent, limit the current through the parasitic transistor, it is believed that such emulators disadvantageously permit at least some current to be shunted to ground by the parasitic transistor, thereby robbing the bootstrap capacitor of at least some of the current required for charging. In this manner, the bootstrap capacitor charges more slowly, making such conventional bootstrap diode emulators ineffective for certain applications, such as high frequency half-bridge driver applications.

SUMMARY OF THE INVENTION

It is an object of the present invention to overcome the disadvantages of the conventional bootstrap diode emulators described above. For this purpose, the present invention provides a bootstrap diode emulator operable to dynamically bias the back-gate of the LDMOS transistor when the LDMOS is turned on by applying a voltage to the back-gate of the LDMOS transistor that is close to but slightly lower than the voltage of the drain of the LDMOS transistor. In this manner, the base-emitter junction of the parasitic transistor remains reverse biased and, as such, never turns on to shunt current away from bootstrap capacitor charging. Furthermore, such dynamic biasing causes the turn-on threshold of the LDMOS transistor to be close to its zero voltage biasing magnitude, thereby minimizing its Rdson for a given gate to source voltage.

DETAILED DESCRIPTION OF THE FIGURES

Figure 3:
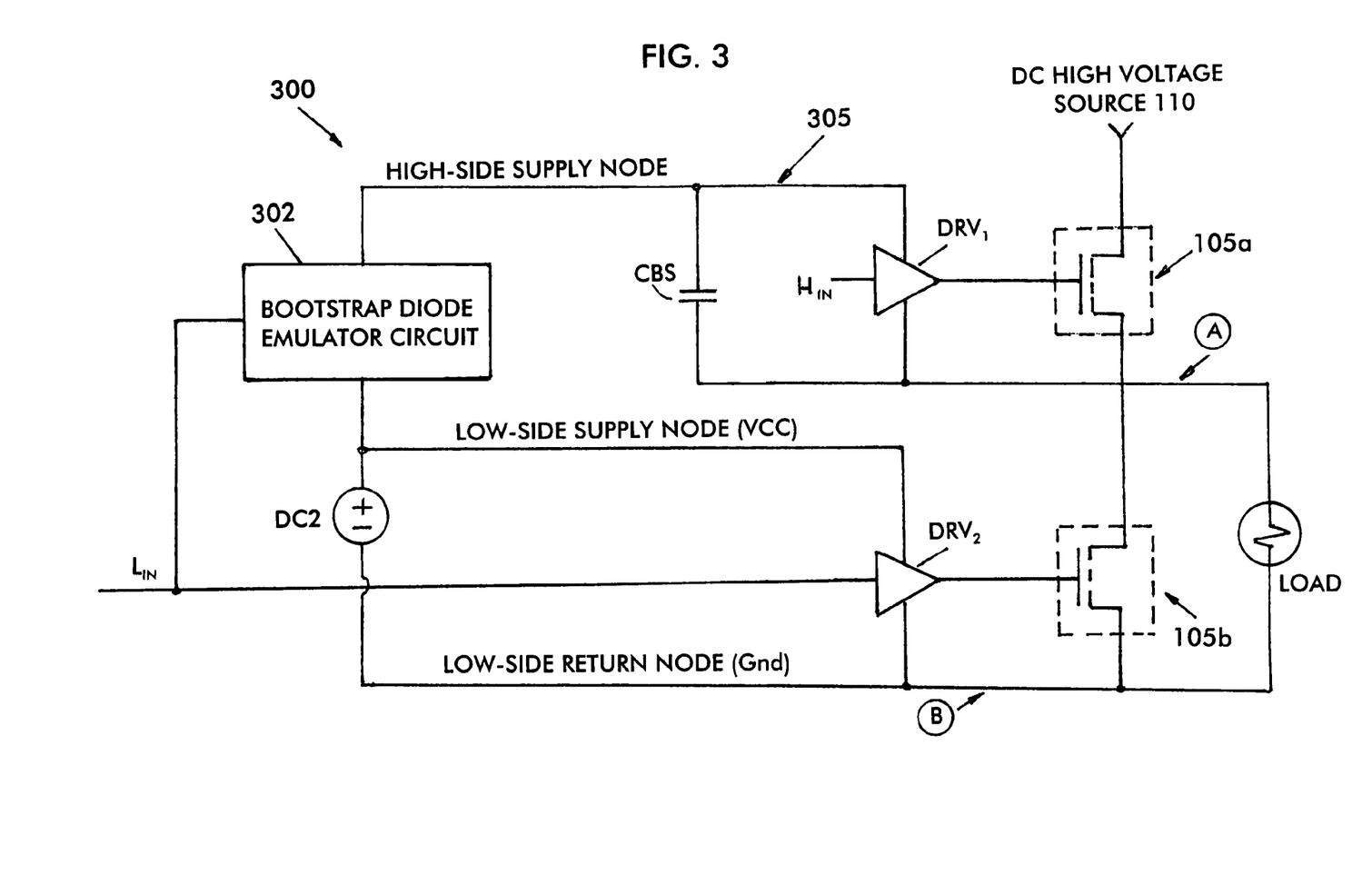
FIG. 3 illustrates a half-bridge driver circuit employing a bootstrap diode emulator according to the present invention.

Referring now to FIG. 3, there is seen a half bridge switching circuit 300 according to the present invention. Half bridge switching circuit 300 is similar to the conventional switching circuit of FIG. 2, except that a bootstrap diode emulator 302 is provided in place of diode DBS. Bootstrap diode emulator 302 operates to provide high-side supply node 305 with a voltage approximately equal to low side voltage supply DC2 when low-side driver DRV2 is operated to turn on FET device 105b. Specifically, when transistor 105b is turned on, bootstrap diode emulator 302 allows current to flow from power supply DC2 to capacitor CBS, thereby charging capacitor CBS to approximately the voltage level of DC power supply DC2. When transistor 105b is turned off and transistor 105a is turned on, bootstrap diode emulator 302 prevents current flow from DC2 to capacitor CBS, with the charge stored in bootstrap capacitor CBS supplying buffer DRV1 with voltage. It should be appreciated that FET devices 105a, 105b maybe implemented using other switching devices, such as IGBTs. It should also be appreciated that the high-side and low-side control inputs, $H_{IN}$ and $L_{IN}$, are not germane to the invention and may be replaced with any number of control inputs, such as a single control input. This single control input may be fed directly to one of the buffers DRV1, DRV2, with the other one of buffers DRV1, DRV2 receiving an inversion of the single control input. This "inversion" may be accomplished, for example, by using a conventional inverter gate known in the art.

Figure 4:
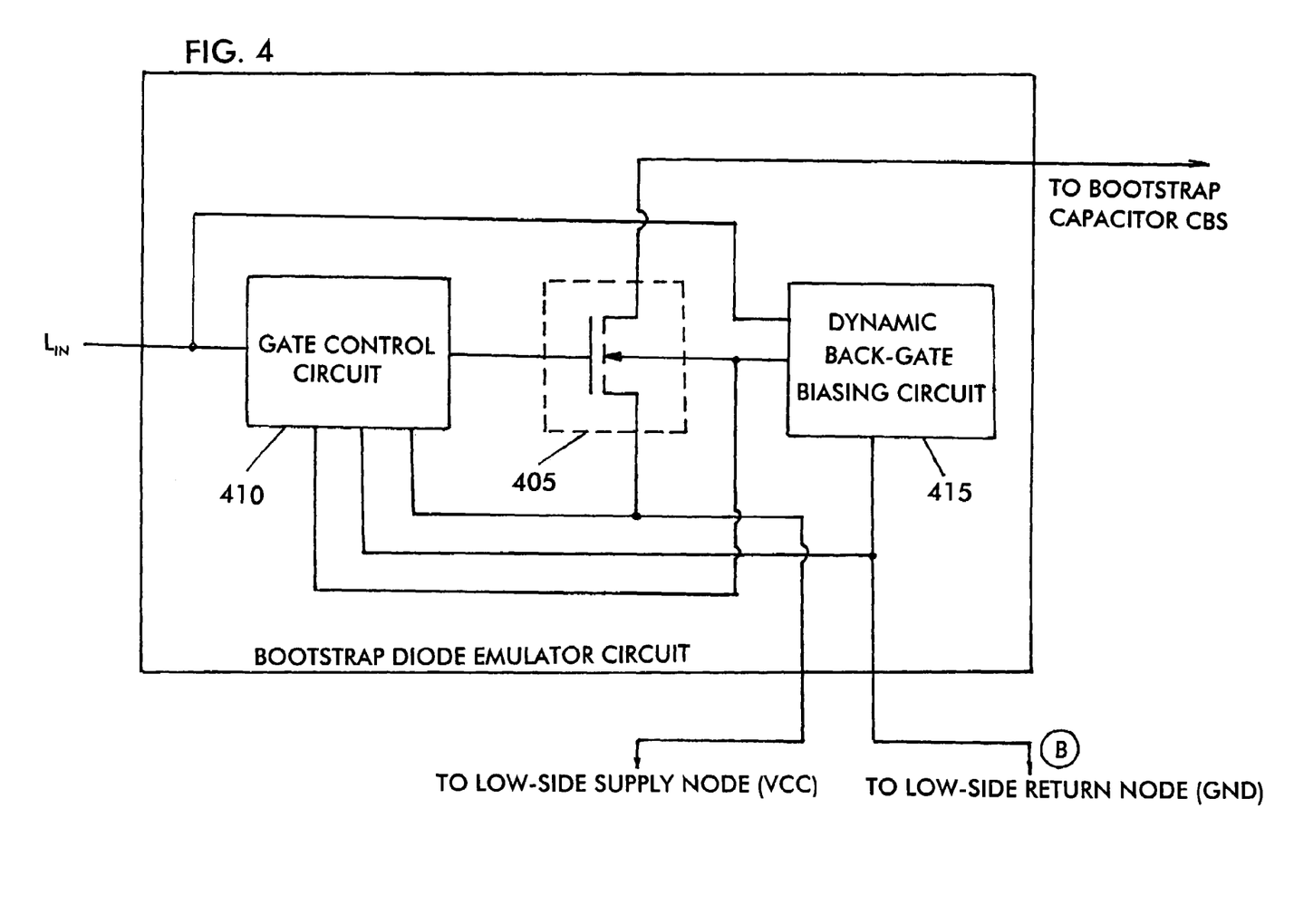
FIG. 4 is a block diagram showing further detail of the bootstrap diode emulator of FIG. 3.

Referring now to FIG. 4, there is seen an exemplary bootstrap diode emulator 302 according to the present invention. Bootstrap diode emulator 302 includes an LDMOS transistor 405, a gate control circuit 410 electrically coupled to the gate of LDMOS transistor 405, and a dynamic back-gate biasing circuit 415 electrically coupled to the back-gate of LDMOS transistor 405. Gate control circuit 410 and dynamic back-gate biasing circuit 415 are also connected to low-side supply and return nodes and low-side control input $L_{IN}$. The source of LDMOS transistor 405 is connected to the low-side supply node (Vcc) and the drain terminal of LDMOS transistor 405 is connected to bootstrap capacitor CBS.

LDMOS transistor 405 is formed around the perimeter of a high-side well, with the on-resistance of LDMOS transistor 405 depending on the total perimeter of the high-side well. The on-resistance of LDMOS transistor 405 may be made small enough to support the current needed to charge bootstrap capacitor CBS during the short turn-on time of LDMOS transistor 405.

Figure 5:
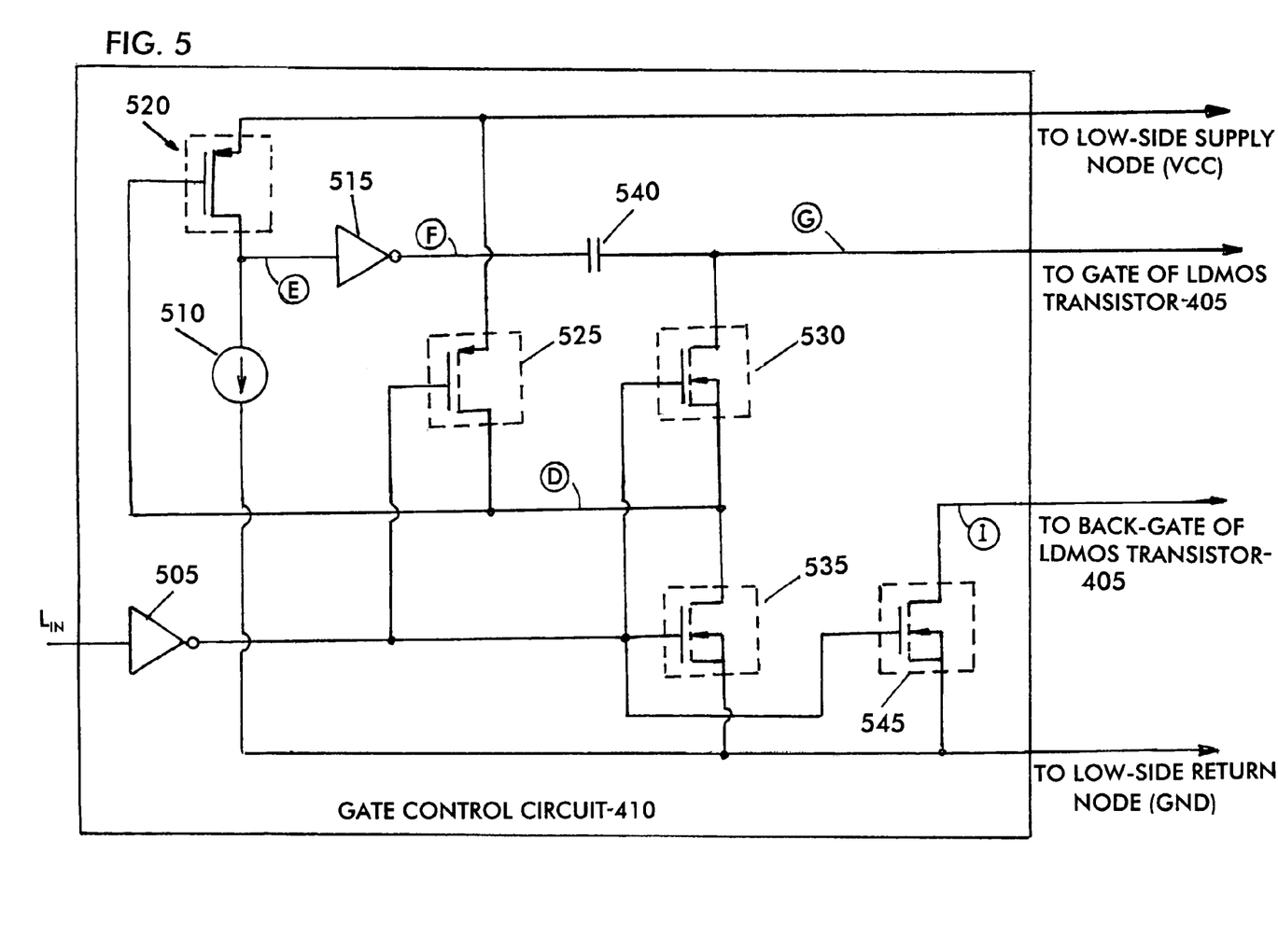
FIG. 5 illustrates a gate control circuit according to the present invention.

Gate control circuit 410 includes circuitry operable to turn on LDMOS transistor 405 when low-side driver DRV2 is operated to turn on FET device 105b. For this purpose, gate control circuit 410 receives low-side driver control input $L_{IN}$, which indicates whether low-side driver DRV2 is operated. Referring now to FIG. 5, there is seen an exemplary gate control circuit 410 according to the present invention. Gate control circuit 410 includes transistors 530, 535 connected in a totem pole configuration at node "D" between the gate of LDMOS transistor 405 and the low-side return node (Gnd), transistor 525 electrically coupled to both node "D" and the low-side supply node (Vcc), a transistor 545 electrically coupled between the back-gate of LDMOS transistor 405 and the low side-return node (Gnd), an inverter 505 electrically coupled to the gates of transistors 525, 530, 535, 545, a capacitor 540 electrically coupled to the drain of transistor 530, an inverter 515 electrically coupled to capacitor 540, a current source 510 coupled between inverter 515 and the low-side return node (Gnd), and a transistor coupled between inverter 515 and the low side supply node (Vcc), with the gate of transistor 520 being connected to node "D".

In operation, gate control circuit 410 turns on LDMOS transistor 405 in accordance with low-side driver control input $L_{IN}$. For this purpose, gate control circuit 410 supplies a positive voltage to the gate of LDMOS transistor 405 in relation to its source. Since the source of LDMOS transistor 405 is connected to the low-side supply node (Vcc), a charge pump is required to drive the gate of LDMOS transistor 405 above low-side supply node (Vcc). This is performed by bootstrap charging capacitor 540 and applying this voltage to the gate of LDMOS transistor 405.

When the low-side control input $L_{IN}$ is low (e.g., zero volts), the voltage at each node of capacitor 540 is held at zero volts. The gate of LDMOS transistor 405 is held at zero volts by transistors 530, 535 and the back-gate of LDMOS transistor 405 is held at zero volts by transistor 545. In this state, the voltages applied to the gate and body of LDMOS transistor 405 are negative with respect to the source node of LDMOS transistor 405. Thus, LDMOS transistor 405 remains off and the "body effect" increases the turn on threshold of LDMOS transistor 405 above that of the zero volt body/source bias level. This is important because LDMOS transistor 405 should not turn on at the wrong time, especially during voltage transitions of lode-node "A". In applications where there is a high rate of dV/dt at lode-node "A", the miller effect current of LDMOS transistor 405 may be quite large, thereby causing a rise in voltage at the gate of LDMOS transistor 405. By maximizing the turn on threshold of LDMOS transistor 405 using the "body effect," the potential for unintended turn on of LDMOS transistor 405 is minimized.

When the low-side control input $L_{IN}$ is high, transistors 530, 535 are turned off and transistor 525 is turned on. The voltage at node "D" is pulled to Vcc by transistor 525 after a finite delay. This finite delay is due to the capacitive loading of node "D" by the gate of LDMOS transistor 405 and capacitor 540 through the body diode of transistor 530. During this finite time, transistor 520 remains on, node "E" is held high, and node "F" is driven low. This causes the voltage across capacitor 540 to increase with respect to node "F". Once the voltage at node "D" rises to approximately the low-side supply node (Vcc) voltage, transistor 520 turns off and the voltage at node "E" is pulled low by current source 510. This causes the voltage at node "F" to be pulled to the low-side supply node (Vcc) voltage by inverter 515, and the voltage at node "G" is pulled above the low-side supply node (Vcc) by a voltage equal to the amount of charge voltage maintained in capacitor 540. The effective voltage magnitude at node "G" at this time is ideally equal to two times the low-side supply node (Vcc). However, the voltage at node "G" is generally lower in voltage by an amount approximately equal to the sum of the body diode voltage drop of transistor 530 and the threshold voltage of transistor 520. Nonetheless, since the voltage at node "G" (i.e.

approximately two times the low-side supply node (Vcc)) is substantially higher than the threshold voltage of LDMOS transistor 405, LDMOS transistor 405 turns on. This causes the drain node of LDMOS transistor 405 to charge to approximately the low-side supply node (Vcc) for charging bootstrap capacitor CBS.

Figure 6:
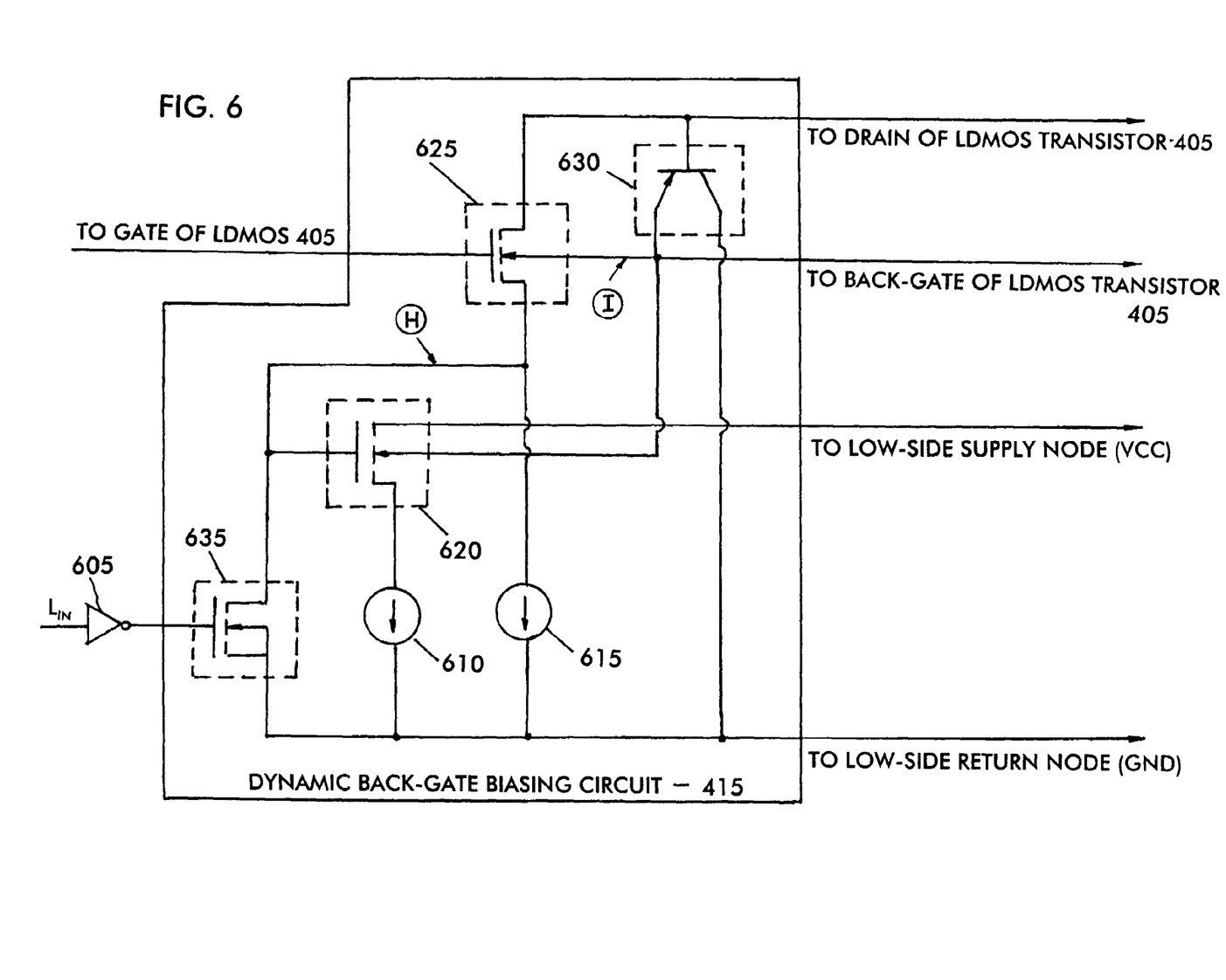
FIG. 6 illustrates an exemplary dynamic back-gate biasing circuit according to the present invention.

Referring now to FIG. 6, there is seen an exemplary dynamic back-gate biasing circuit 415 according to the present invention. Dynamic back-gate biasing circuit 415 includes transistor 635, inverter 605 electrically coupled to the gate of transistor 635, a current source electrically coupled to the low-side return node (Gnd), a transistor 620 electrically coupled between the low-side supply node (Vcc) and current source 610, a current source 615 electrically coupled to the low-side return node (Gnd), a transistor 625 electrically coupled between current source 615 and the drain of LDMOS transistor 405, and a parasitic transistor 630 electrically coupled between the back-gate of LDMOS transistor 405 and the low-side return node (Gnd).

When LDMOS transistor 405 is turned on, bootstrap capacitor CBS begins to charge to a voltage approximately equal to the low-side supply node (Vcc). The amount of time that it takes for the bootstrap capacitor to charge depends on the capacitance of bootstrap capacitor CBS and the Rdson of LDMOS transistor 405. The Rdson value depends on both the size of LDMOS transistor 405 and the voltage applied to the gate of LDMOS transistor 405 relative to its turn-on threshold. As described above, the voltage applied to the back-gate of LDMOS transistor 405 is kept negative with respect to the source voltage to help ensure that LDMOS transistor 405 does not turn on at inappropriate times. However, this causes the Rdson of LDMOS transistor 405 to be larger for a given gate to source voltage, than if the back-gate of LDMOS transistor 405 were held at the same potential as its source. The larger Rdson of LDMOS transistor 405 disadvantageously increases the time needed to charge bootstrap capacitor CBS to its maximum level.

Therefore, to correct for the large Rdson, it is desirous to raise the voltage of the back-gate while the bootstrap capacitor is charging. In this manner, the time required to charge bootstrap capacitor CBS is reduced. However, due to the LDMOS construction of transistors 405, 625, a parasitic shunting of current may occur if the back-gate voltage of LDMOS transistors 405, 625 is raised at or near the voltage of the drains of LDMOS transistors 405, 625. The parasitic shunting of current is modeled by parasitic PNP transistor 630, which operates to shunt current from the drains of LDMOS transistors 405, 625 to the low-side return node (Gnd) when turned on, thereby diverting current needed to charge bootstrap capacitor CBS.

To correct for this disadvantage, transistors 620, 625, 630, 635 and current sources 610, 615 form a dynamic back-gate biasing circuit 415. This circuit 415 operates to apply a voltage to the back-gate of LDMOS transistors 405, 625 that is close to but always slightly lower than the voltage of the drains of LDMOS transistors 405, 625. In this manner, the base-emitter junction of the parasitic transistor 630 remains reverse biased and therefore does not turn on.

Dynamic back-gate biasing circuit 415 works by sensing the voltage at the drain of LDMOS transistor 405 during the turn on time of LDMOS transistors 405. During the turn-on time, transistor 635 is turned on, and nodes "H" and "I" are held at zero volts by transistors 635, 545, respectively. Transistor 620 is turned off since its gate and source are held at the same potential. The gate of transistor 625 is held at zero volts and is also turned off during this time. The back-gate connections of LDMOS transistors 405, 625 are held at zero volts by transistor 545, when the low-side control input $L_{IN}$ is pulled high.

Figure 7:
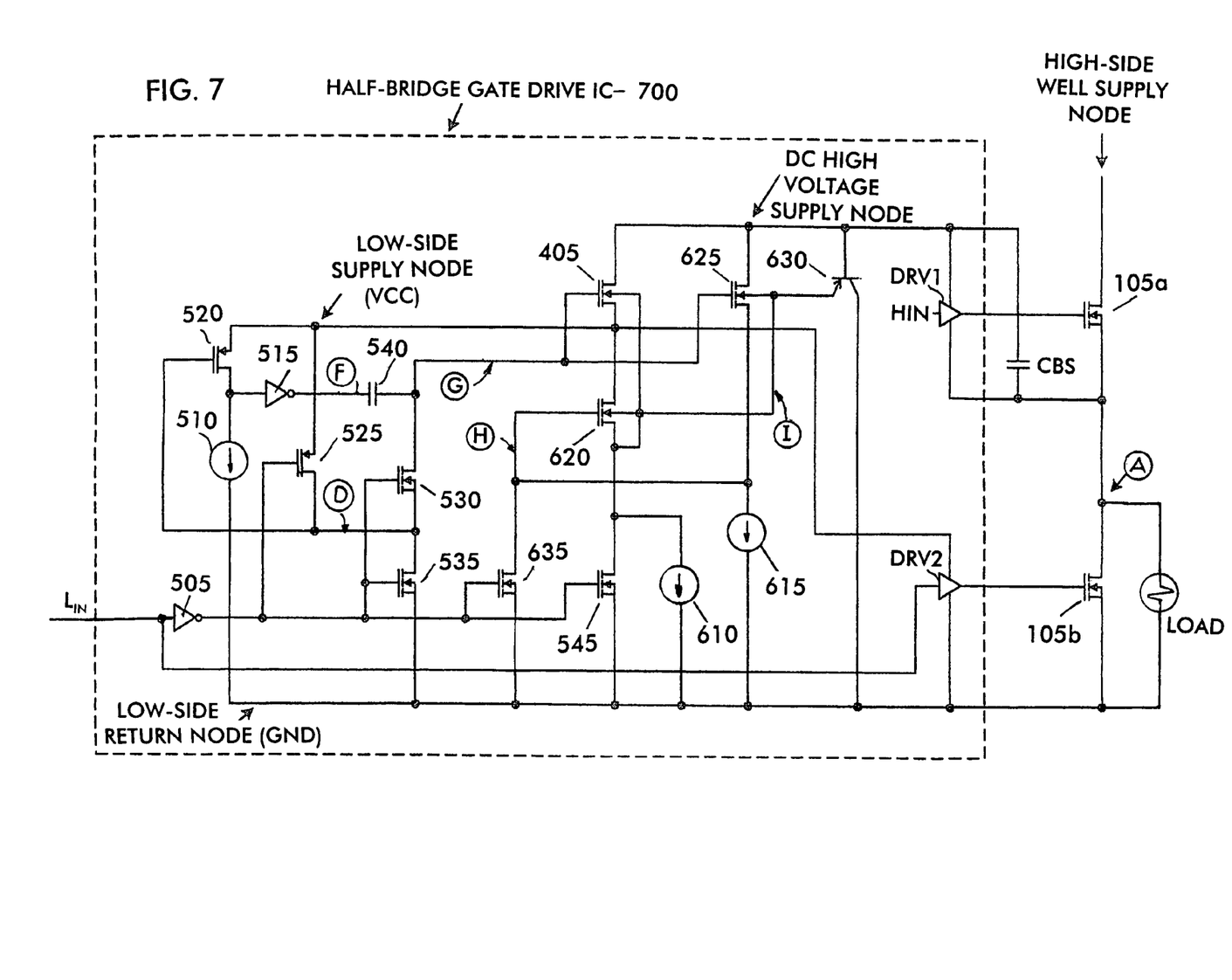
FIG. 7 illustrates a half-bridge gate drive integrated circuit according to the present invention.

Referring now to FIG. 7, there is seen an exemplary half-bridge integrated circuit 700 according to the present invention. Integrated circuit 700 includes gate control circuit 410, LDMOS transistor 405, dynamic back-gate biasing circuit 415, high-side driver DRV1, and low-side driver DRV2 in a flattened non-hierarchal representation. Half-bridge integrated circuit 700 may be used in a conventional half-bridge driver circuit to drive transistors 105a, 105b for various applications such as motor drives, electronic ballasts for fluorescent lamps and power supplies.

What is claimed is:

1. A bootstrap diode emulator circuit for use with a half-bridge switching circuit, the switching circuit including low-side and high-side transistors connected to one another in a totem pole configuration at a load node, the low-side and high-side transistors having respective gate nodes; a driver circuit electrically coupled to the gate nodes of the low-side and high-side transistors, the driver circuit being controllable by at least one control input; a low-side voltage supply to produce a low-side voltage on a low-side supply node; and a bootstrap capacitor coupled between a high-side supply node and the load node, the bootstrap diode emulator circuit comprising:

an LDMOS transistor having a gate, a back-gate, a source and a drain, the drain of the LDMOS transistor being coupled to the high-side supply node, the source of the LDMOS transistor being coupled to the low-side supply node;

a gate control circuit electrically coupled to the gate of the LDMOS transistor, and a dynamic back-gate biasing circuit electrically coupled to the back-gate of the LDMOS transistor;

wherein the gate control circuit is operable to turn on the LDMOS transistor in accordance with the at least one control input and the dynamic back-gate biasing circuit is operable to -dynamically bias the back-gate of the LDMOS transistor when the LDMOS is turned on by applying a voltage to the back-gate of the LDMOS transistor that is close to but slightly lower than a voltage of the drain of the LDMOS transistor.

2. The bootstrap diode emulator circuit of claim 1, wherein the low-side and high-side transistors include one of FET devices and IGBT devices.

3. The bootstrap diode emulator circuit of claim 1, wherein the driver circuit includes low-side and high-side driver circuits respectively coupled to the gate nodes of the low-side and high-side transistors.

4. The bootstrap diode emulator circuit of claim 3, wherein the at least one control input includes a high-side control input and a low-side control input, the high-side driver being controllable by the high-side control input, the low-side driver being controllable by the low-side control input.

5. The bootstrap diode emulator circuit of claim 1, wherein the gate control circuit includes:

first and second transistors having respective source, drain, and gate nodes, the source of the first transistor being coupled to the drain of the second transistor at a first node, the drain of the first transistor being coupled to the gate of the LDMOS transistor, the source of the second transistor being coupled to the low-side return node;

a third transistor having source, drain, and gate nodes, the drain of the third transistor being coupled to the first node, the source of the second transistor being coupled to the low-side supply node;

a fourth transistor having source, drain, and gate nodes, the drain of the fourth transistor being coupled to the back-gate of the LDMOS transistor, the source of the fourth transistor being coupled to the low-side return node;

a first inverter having an input and an output, the input of the first inverter being coupled to the low-side control input, the output of the first inverter being coupled to the gates of the first, second, third, and fourth transistors;

a capacitor having first and second terminals, the first terminal of the capacitor being coupled to the gate of the LDMOS transistor;

a second inverter having an input and an output, the output of the second inverter being coupled to the second terminal of the capacitor;

a fifth transistor having source, drain, and gate nodes, the drain of the fifth transistor being coupled to the input of the second inverter, the source of the fifth transistor being coupled to the low-side supply node, the gate of the fifth transistor being coupled to the first node; and a first current source having first and second terminals, the first terminal of the first current source being coupled to the input of the second inverter, the second terminal of the first current source being coupled to the low-side return node.

6. The bootstrap diode emulator circuit of claim 1, wherein the dynamic back-gate biasing circuit includes:

a first transistor having source, drain, and gate nodes, the gate node being coupled to the low-side control input via an inverter, the source of the first transistor being coupled to the low-side return node;

a second transistor having source, drain, gate, and back-gate nodes, the gate of the second transistor being coupled to the drain of the first transistor, the back-gate of the second transistor being coupled to the back-gate of the LDMOS transistor, the drain of the second transistor being coupled to the low-side supply node;

a first current source having first and second terminals, the first terminal of the first current source being coupled to the source of the second transistor, the second terminal of the first current source being coupled to the low-side return node;

a third transistor having source, drain, gate, and back-gate nodes, the source of the third transistor being coupled to the gate of the second transistor, the gate of the third transistor being coupled to the gate of the LDMOS transistor, the drain of the third transistor being coupled to the drain of the LDMOS transistor;

a second current source having first and second terminals, the first terminal of the second current source being coupled to the source of the third transistor, the second terminal of the second current source being coupled to the low-side return node; and a PNP parasitic transistor having base, emitter, and collector nodes, the base of the parasitic transistor being coupled to the drain of the LDMOS transistor, the emitter of the parasitic transistor being coupled to the back-gate of the LDMOS transistor, the collector of the parasitic transistor being coupled to the low-side return node.

7. A half-bridge switching circuit to control low-side and high-side transistors electrically connected to one another at a load node in a totem pole configuration, the low-side and high-side transistors having respective gate nodes, a bootstrap capacitor being electrically coupled between a high-side supply node and the load node, the half-bridge switching circuit comprising:

a driver circuit electrically coupled to the gate nodes of the low-side and high-side transistors, the driver circuit being controllable by at least one control input;

a low-side voltage supply to produce a low-side voltage on a low-side supply node; and a bootstrap diode emulator circuit coupled to the low-side supply node and including an LDMOS transistor having source, gate, drain, and back-gate nodes, the LDMOS transistor being controllable to supply the high-side supply node with a voltage approximately equal to the low-side voltage when the low-side driver is operated, the bootstrap diode emulator being operable to dynamically bias the back-gate node of the LDMOS transistor by applying a voltage to the back-gate of the LDMOS transistor that is close to but slightly lower than a voltage of the drain node of the LDMOS transistor.

8. The half-bridge switching circuit of claim 7, wherein the low-side and high-side transistors include one of FET devices and IGBT devices.

9. The half-bridge switching circuit of claim 7, wherein the driver circuit includes low-side and high-side driver circuits respectively coupled to the gate nodes of the low-side and high-side transistors.

10. The half-bridge switching circuit of claim 9, wherein the at least one control input includes a high-side control input and a low-side control input, the high-side driver being controllable by the high-side control input, the low-side driver being controllable by the low-side control input.

11. The half-bridge switching circuit of claim 7, wherein the bootstrap diode emulator further includes a gate control circuit operable to turn on the LDMOS transistor in accordance with the at least one control input, the gate control circuit including:

first and second transistors having respective source, drain, and gate nodes, the source of the first transistor being coupled to the drain of the second transistor at a first node, the drain of the first transistor being coupled to the gate of the LDMOS transistor, the source of the second transistor being coupled to the low-side return node;

a third transistor having source, drain, and gate nodes, the drain of the third transistor being coupled to the first node, the source of the second transistor being coupled to the low-side supply node;

a fourth transistor having source, drain, and gate nodes, the drain of the fourth transistor being coupled to the back-gate of the LDMOS transistor, the source of the fourth transistor being coupled to the low-side return node;

a first inverter having an input and an output, the input of the first inverter being coupled to the low-side control input, the output of the first inverter being coupled to the gates of the first, second, third, and fourth transistors;

a capacitor having first and second terminals, the first terminal of the capacitor being coupled to the gate of the LDMOS transistor;

a second inverter having an input and an output, the output of the second inverter being coupled to the second terminal of the capacitor;

a fifth transistor having source, drain, and gate nodes, the drain of the fifth transistor being coupled to the input of the second inverter, the source of the fifth transistor being coupled to the low-side supply node, the gate of the fifth transistor being coupled to the first node; and a first current source having first and second terminals, the first terminal of the first current source being coupled to the input of the second inverter, the second terminal of the first current source being coupled to the low-side return node.

12. The half-bridge switching circuit of claim 7, wherein the boot strap diode emulator includes a dynamic back-gate biasing circuit operable to dynamically bias the back-gate of the LDMOS transistor when the LDMOS is turned on by applying the voltage to the back-gate of the LDMOS transistor that is close to but slightly lower than the voltage of the drain of the LDMOS transistor, the dynamic back-gate biasing circuit including:

a first transistor having source, drain, and gate nodes, the gate node being coupled to the low-side control input via an inverter, the source of the first transistor being coupled to the low-side return node;

a second transistor having source, drain, gate, and back-gate nodes, the gate of the second transistor being coupled to the drain of the first transistor, the back-gate of the second transistor being coupled to the back-gate of the LDMOS transistor, the drain of the second transistor being coupled to the low-side supply node;

a first current source having first and second terminals, the first terminal of the first current source being coupled to the source of the second transistor, the second terminal of the first current source being coupled to the low-side return node;

a third transistor having source, drain, gate, and back-gate nodes, the source of the third transistor being coupled to the gate of the second transistor, the gate of the third transistor being coupled to the gate of the LDMOS transistor, the drain of the third transistor being coupled to the drain of the LDMOS transistor;

a second current source having first and second terminals, the first terminal of the second current source being coupled to the source of the third transistor, the second terminal of the second current source being coupled to the low-side return node; and a PNP parasitic transistor having base, emitter, and collector nodes, the base of the parasitic transistor being coupled to the drain of the LDMOS transistor, the emitter of the parasitic transistor being coupled to the back-gate of the LDMOS transistor, the collector of the parasitic transistor being coupled to the low-side return node.

* * * * *